United States Patent [19]

Hattori

[11] Patent Number: 5,057,720
[45] Date of Patent: Oct. 15, 1991

[54] OUTPUT BUFFERING H-BRIDGE CIRCUIT
[75] Inventor: Masayuki Hattori, Tokyo, Japan
[73] Assignee: NEC Corporation, Tokyo, Japan
[21] Appl. No.: 446,159
[22] Filed: Dec. 5, 1989
[30] Foreign Application Priority Data
  Dec. 5, 1988 [JP] Japan ................. 63-308201
[51] Int. Cl.$^5$ ................. H03K 19/003; H03K 19/017; H03K 19/094; H03K 17/13
[52] U.S. Cl. ................. 307/571; 307/583; 307/584; 307/263; 307/270
[58] Field of Search ............... 307/571, 583, 254, 270, 307/257, 263; 323/315

[56] References Cited
U.S. PATENT DOCUMENTS 4,683,387 7/1987 Jones et al. ................. 307/571
4,818,901 4/1989 Young et al. ................. 307/451

Primary Examiner—Stanley D. Miller
Assistant Examiner—Trong Phan
Attorney, Agent, or Firm—Helfgott & Karas

[57] ABSTRACT

An output buffering H-bridge circuit comprises a first MOS transistor, a second MOS transistor, a third MOS transistor and a fourth MOS transistor. The circuit further comprises a fifth MOS transistor having a drain connected to the first internal input terminal, a source connected to the terminal of ground, and a gate connected to the second output terminal, and a sixth MOS transistor having a drain connected to the second internal input terminal, a source connected to the terminal of ground and a gate connected to the first output terminal.

5 Claims, 3 Drawing Sheets

OUTPUT BUFFERING H-BRIDGE CIRCUIT

BACKGROUND OF THE INVENTION

The present invention relates to an output buffering circuit, and particularly to a H-bridge circuit used to control motor or the like, which is designed to provide direct microprocessor interface to low voltage motors.

Such a semiconductor device is known from David Cave, David Soo, T. Sakurai, M. Kojima and S. Utsumi, "Smartpower Motor Driver For Low Voltage Applications" IEEE 1987 Custom Integrated Circuits Conference. As shown in FIG. 1, one example of the device is composed of four N-channel MOS transistors 5 to 8 connected as an output buffering H-bridge circuit. To explain it in detail, the device shown in FIG. 1 comprises a control circuit 11 for feeding a first internal input terminal 12 and a second internal input terminal 13 and a H-bridge circuit composed of a first N-channel MOS transistor 5 having a drain connected to a terminal 3 of power source, a source connected to a first output terminal 9, a gate connected to the first internal input terminal 12, a second N-channel MOS transistor 6 having a drain connected to a first output terminal 9, a source connected to a terminal 4 of ground and a gate connected to the second internal input terminal 13, a third N-channel MOS transistor 7 having a drain connected to the terminal 3 of power source, a source connected to the second output terminal 10 and a gate connected to the second internal input terminal 13, and a fourth N-channel MOS transistor 8 having a drain connected to the second output terminal 10, a source connected to the terminal 4 of ground and a gate connected to the first internal input terminal 12. The first output terminal 9 is connected to the second output terminal 10 through a load. The above control circuit 11 has a terminal of power source 2, a terminal 4 of ground and an input terminal 1.

FIG. 2 is a characteristic curve of shoot-through current flowing in said device shown in FIG. 1.

Then, the operation of the semiconductor device shown in FIG. 1 is explained with reference to FIG. 2.

When electric potential of the first internal input terminal 12 is high, the first N-channel MOS transistor 5 and the fourth N-channel MOS transistor 8 becomes conductive. Therefore electric potential of the first output terminal 9 approaches about $V_M$ while electric potential of the second output terminal 10 approaches about 0 V. On the other hand, when electric potential of the second internal input terminal 13 is high, the second N-channel MOS transistor 6 and the third N-channel MOS transistor 7 become conductive. Therefore electric potential of the first output terminal 9 approaches about 0V while electric potential of the second output terminal 10 approaches about $V_M$.

Electric potential of the first internal input terminal 12 and that of the second internal input terminal 13 are controlled by the control circuit 11 so as not to become high at the same time. However, when the above-mentioned output buffering H-bridge circuit is composed of four N-channel MOS transistors as described hereabove the switching speed of the MOS transistor on source power source side is slow as compared with the switching speed of the MOS transistor on the ground side, the MOS transistor 5 on the power source side and the MOS transistor 6 on the ground side become conductive at the same time; therefore shoot-through current flows from the terminal 3 of the power source to the terminal 4 of the ground through the first and second N-channel MOS transistors 5, 6 which results in the consumption of electricity corresponding to the shadowed portion shown in FIG. 2.

The above-mentioned conventional semiconductor device has a disadvantage that because of the difference in the switching speeds between the transistor on the power source side and the transistor on the ground side, the shoot-through current flows in the H-bridge circuit, therefore the amount of the consumed electricity in the H-bridge circuit increases. Further, the above-described device has a disadvantage that because of the shoot-through current, a big spike noise is produced at the terminal 3 of the power source and at the terminal 4 of the ground, and malfunction of the integrated circuit occurs.

SUMMARY OF THE INVENTION

It is an object of the present invention to provide a semiconductor device wherein the increase in the amount of consumed electricity can be controlled and also the production of spike noise is surpressed by lessening the time required for a shoot-through current flowing through the device.

The above-mentioned object is attained by a semiconductor device comprising a H-bridge circuit including a first MOS transistor having a drain connected to a terminal of a power source, a source connected to a first output terminal and a gate connected to a first internal input terminal, a second MOS transistor having a drain connected to the first output terminal, and a source connected to a terminal of ground and a gate connected to a second internal input terminal, a third MOS transistor having a drain connected to the terminal of power source, a source connected to a second output terminal and a gate connected to the second internal input terminal, and a fourth MOS transistor having a drain connected to the second output terminal, a source connected to the terminal of ground and a gate connected to the first internal input terminal, wherein said semiconductor device further comprises a fifth MOS transistor having a drain connected to the first internal input terminal, a source connected to the terminal of ground and a gate connected to the second output terminal, and a sixth MOS transistor having a drain connected to the second internal input terminal, a source connected to the terminal of ground and a gate connected to the first output terminal.

In the semiconductor device according to the present invention, the fifth MOS transistor and the sixth MOS transistor may be N-channel MOS transistors.

In the semiconductor device according to the present invention, the first MOS transistor, the second MOS transistor, the third MOS transistor and the fourth MOS transistor may be N-channel MOS transistors.

In the present invention when the first, second, third, fourth, fifth and sixth MOS transistors are N-channel MOS transistors, if the fourth N-channel MOS transistors becomes nonconductive, the fifth N-channel MOS transistor becomes conductive so that the gate voltage of the first N-channel MOS transistor is turned to the ground potential, which results in quick discharge from the gate of the first N-channel MOS transistor through the fifth N-channel MOS transistor. On the other hand, when the second N-channel MOS transistor becomes nonconductive, the sixth N-channel MOS transistor becomes conductive so that the gate voltage of the N-channel MOS transistor is turned to the ground potential, which results in quick discharge from the gate of the third N-channel MOS transistor through the sixth N-channel MOS transistor.

The quick discharge from the gate of the first MOS transistor or from the gate of the third MOS transistor results in the reduction of time required for shoot-through current flowing in the output circuit.

Further, according to the present invention, as the first, second, third and fourth MOS transistors, double diffusion type MOS transistors can be used.

BRIEF DESCRIPTION OF THE DRAWINGS

FIG. 1 is a circuit diagram of a conventional semiconductor device used to control motor or the like;

DETAILED DESCRIPTION OF THE PREFERRED EMBODIMENTS

The present invention is then explained with reference to the drawings.

Figure 3:
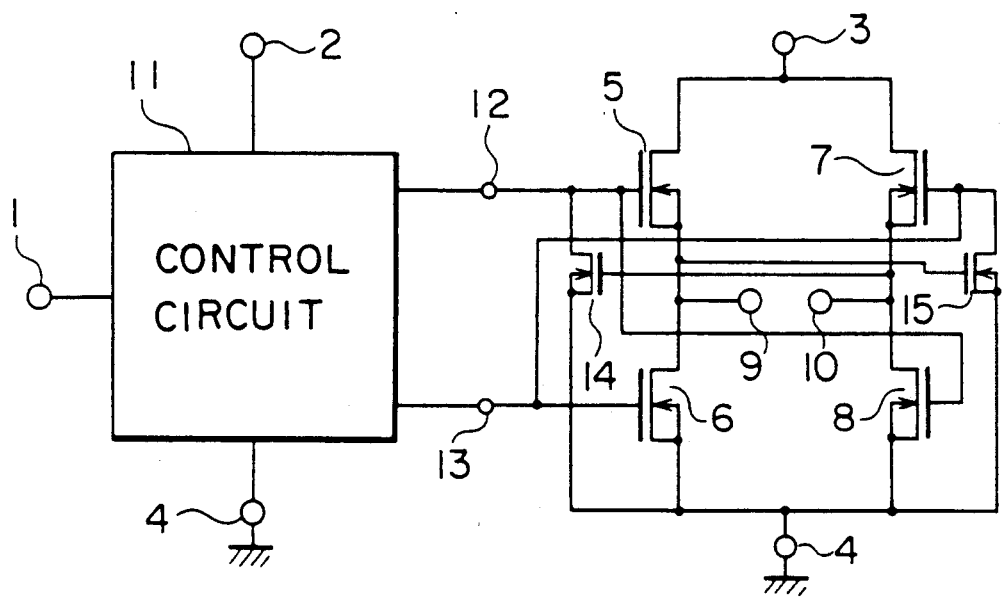
FIG. 3 is a circuit diagram of a first embodiment of the present invention.

FIG. 3 shows a first embodiment of the present invention.

Figure 1:
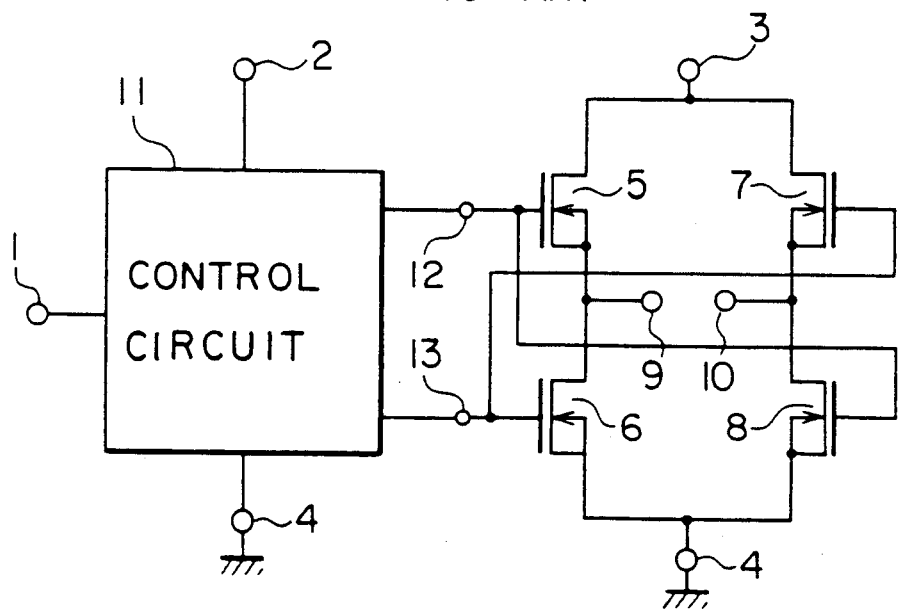

As is obvious from comparison of FIG. 3 with FIG. 1, the first embodiment of the present invention differs from the conventional semiconductor device shown in FIG. 1 in that the first embodiment comprises further two N-channel MOS transistors 14, 15.

The first embodiment of the present invention comprises a control circuit 11 for feeding a first internal input terminal 12 and a second internal input terminal 13, and a first N-channel MOS transistor 5 having a drain connected to a terminal 3 of the power source, a source connected to the first output terminal 9 and a gate connected to the first internal input terminal 12, a second MOS transistor 6 having a drain connected to the first output terminal 9, and a source connected to a terminal 4 of ground and a gate connected to the second internal input terminal 13, a third MOS transistor 7 having a drain connected to the terminal 3 of the power source, a source connected to the second output terminal 10 and a gate connected to the second internal input terminal 13, a fourth N-channel MOS transistor 8 having a drain connected to the second output terminal 10, a source connected to the terminal 4 of ground and a gate connected to the first internal input terminal 12, a fifth N-channel MOS transistor 14 having a drain connected to the first internal input terminal 12, a source connected to the terminal 4 of ground and a gate connected to the second output terminal 10 and a sixth N-channel MOS transistor 15 having a drain connected to the second internal input terminal 13, a source connected to the ground terminal 4 of and a gate connected to the first output terminal 9.

Figure 4:
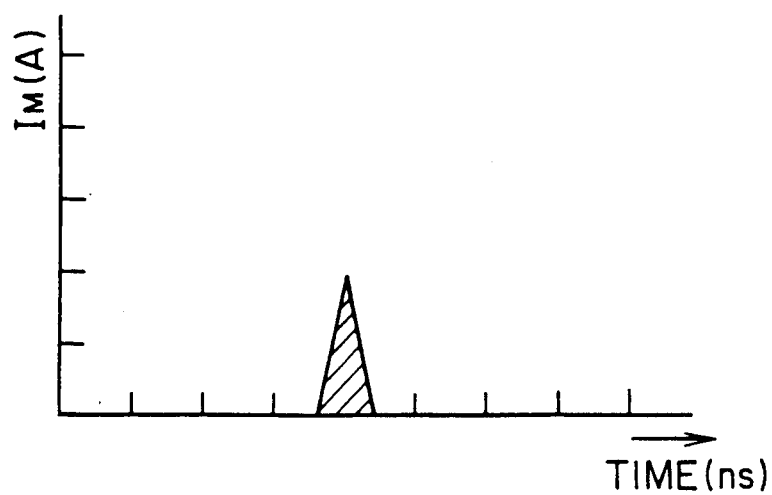
FIG. 4 is a characteristic curve of shoot-through current flowing in the semiconductor device flowing in the semiconductor device shown in FIG. 3.

Then operation of the first embodiment of the present invention is explained with reference to FIG. 4 showing a characteristic curve of shoot-through current flowing in the circuit shown in FIG. 3.

When electric potential of the internal input terminal 12 is high while electric potential of the internal input terminal 13 is low, the first N-channel MOS transistor 5 and the fourth N-channel MOS transistor 8 becomes conductive so that electric potential of the first output terminal 9 approaches about $V_M$ while electric potential of the second output terminal 10 approaches about 0 V. When the electric potential of the first internal input terminal 12 is changed from high potential to low potential while the electric potential of the second internal input terminal 13 is changed from low potential to high potential, the first N-channel MOS transistor 5 and the fourth N-channel MOS transistor 8 become nonconductive while the second N-channel MOS transistor 6 and the third N-channel MOS transistor 7 become conductive. At the transition period of the change of electric potential of the MOS transistors, since the switching speed of N-channel MOS transistor on the power source side is lower than that of N-channel MOS transistor on the ground side as explained hereinabove, the third N-channel MOS transistor 7 becomes conductive before the first N-channel MOS transistor 5 becomes nonconductive.

The difference in the switching speed between the N-channel MOS transistor on the power source side and the N-channel MOS transistor on the ground side is caused by that voltages $V_{GS}$ between the gates and the sources of respective N-channel MOS transistors are different with each other, and thus there is a difference in charging and discharging time the between N-channel MOS transistors, which results in a difference in waveforms of the gate voltage between the N-channel MOS transistors. In order to prevent this, it is necessary to shorten the charging and discharging time of the N-channel MOS transistor. In order to prevent a shoot-through current, a turn-off time is important, therefore it is necessary to shorten the discharging time of the N-channel MOS transistors.

For that reason, in the present invention, fifth and sixth N-channel MOS transistors 14, 15 are further used, by which the fourth N-channel MOS transistor 8 becomes nonconductive while the fifth N-channel MOS transistor 14 becomes conductive so that the gate voltage of the first N-channel MOS transistor 5 is turned to the ground potential, which results in quick discharge from the gate of the first N-channel MOS transistor 5 through the fifth N-channel MOS transistor 14. On the other hand, when the third N-channel MOS transistor 7 becomes nonconductive, the sixth N-channel MOS transistor 15 becomes conductive so that the gate voltage of the third N-channel MOS transistor 7 is turned to the ground potential, which results in quick discharge from the gate of the third N-channel MOS transistor 7 through the sixth N-channel MOS transistor 15.

Figure 2:
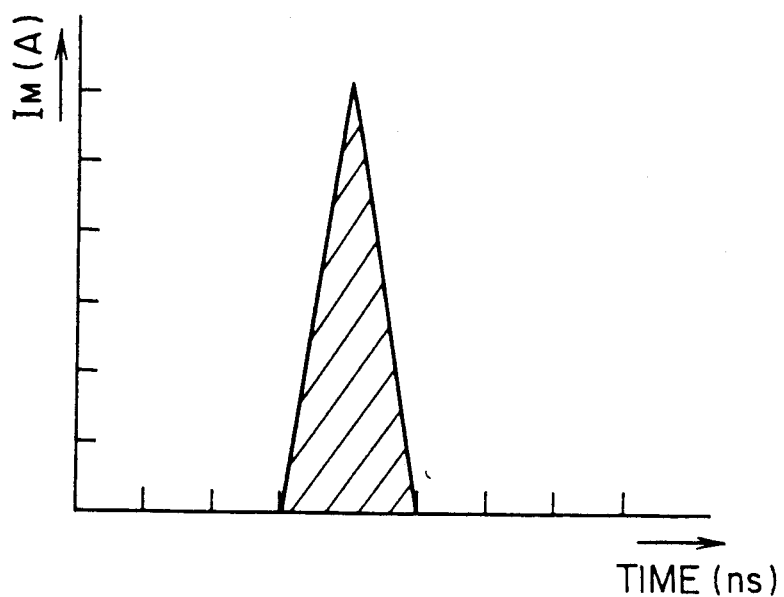
FIG. 2 is a characteristic curve of shoot-through current flowing in the semiconductor device shown in FIG. 1.

Accordingly, as shown in FIG. 3, the amount of shoot-through current becomes smaller due to reduced turn-off time so that the consumption of electricity corresponding to the shadowed portion shown in FIG. 4 becomes extremely smaller than the consumption of electricity by shoot-through current flowing in the conventional semiconductor device as shown in FIG. 2.

Further, the lower is a threshold voltage of the fifth N-channel MOS transistor 14 and the sixth N-channel MOS transistor 15 as compared with a threshold voltage of the first, second, third and fourth N-channel MOS transistors 5 through 8 which form the output buffering H-bridge circuit, the more the amount of the consumption can be reduced.

Figure 5:
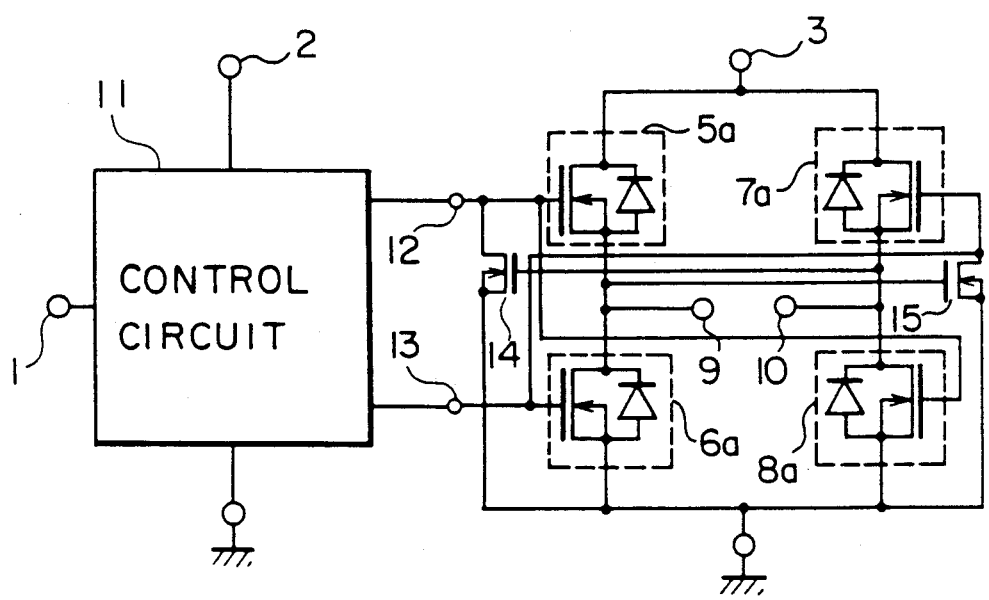
FIG. 5 is a circuit diagram of a second embodiment of the present invention.

FIG. 5 shows a second embodiment of the present invention.

As shown in FIG. 5, use can be made of double diffusion type MOS transistors 5a, 6a, 7a and 8a as the first, second, third and fourth MOS transistors composing the output buffering H-bridge circuit. Each diffusion type MOS transistor is comprised of an N-channel MOS transistor and a diode, the drain of the N-channel MOS transistor and the forward side of the diode being connected at one common terminal and the source of the N-channel MOS transistor and the other side of the diode being connected at another common terminal. When double diffusion type MOS transistors 5a, 6a, 7a and 8a are used, shoot-through current can be prevented in the same manner as with usual N-type MOS transistors.

As above-mentioned, the semiconductor circuit according to the present invention is composed of an output circuit in which shoot-through current is produced and a Schmitt circuit in which positive feedback is provided from output to input, by which the time required for shoot-through current flowing in the output circuit can be reduced so that the increase in the consumption of electricity can be prevented also for the input signal whose rise time and fall time are long and in addition, spike noise produced at a terminal of power source and a terminal of ground can be reduced.

What is claimed is:

1. An output buffering H-bridge circuit comprising a first MOS transistor having a drain connected to a terminal of power source, a source connected to a first output terminal and a gate connected to a first internal input terminal, a second MOS transistor having a drain connected to the first output terminal, a source connected to a ground terminal and a gate connected to a second internal input terminal, a third MOS transistor having a drain connected to the terminal of power source, a source connected to a second output terminal and a gate connected to the second internal input terminal, a fourth MOS transistor having a drain connected to the second output terminal, a source connected to the ground terminal and a gate connected to the first internal input terminal, a fifth MOS transistor having a drain connected to the first internal input terminal, a source connected to the ground terminal, and a gate connected to the second output terminal, and a sixth MOS transistor having a drain connected to the second internal input terminal, a source connected to the ground terminal and a gate connected to the first output terminal whereby a shoot-through current from the terminal of power source to the ground terminal in said circuit is at least substantially reduced.

2. The H-bridge circuit as claimed in claim 1, wherein the fifth MOS transistor and the sixth MOS transistor are N-channel MOS transistors.

3. The H-bridge circuit as claimed in claim 2, wherein the first MOS transistor, the second MOS transistor, the third MOS transistor, and the fourth MOS transistor are N-channel MOS transistors.

4. The H-bridge circuit as claimed in claim 2, wherein the first MOS transistor, the second MOS transistor, the third MOS transistor and the fourth MOS transistor are double diffusion type MOS transistors.

5. The H-bridge circuit as claimed in claim 1, wherein the first MOS transistor and the sixth MOS transistor have a threshold voltage which is lower than a threshold voltage of the first MOS transistor, the second MOS transistor, the third MOS transistor and the fourth MOS transistor.

* * * * *